United States Patent [19]

Specht et al.

[11] 4,278,751

[45] Jul. 14, 1981

[54] PHOTOPOLYMERIZATION CO-INITIATOR COMPOSITIONS COMPRISING AMINE-SUBSTITUTED KETOCOUMARINS AND CERTAIN ACETIC ACID DERIVATIVE ACTIVATORS

[75] Inventors: Donald P. Specht; Kenneth L. Payne; Samir Y. Farid, all of Rochester, N.Y.

[73] Assignee: Eastman Kodak Company, Rochester, N.Y.

[21] Appl. No.: 95,171

[22] Filed: Nov. 16, 1979

[51] Int. Cl.$^3$ .............................................. G03C 1/68
[52] U.S. Cl. ............................... 430/281; 204/159.18; 204/159.23; 252/426; 430/915; 430/919; 430/920; 430/923
[58] Field of Search ............... 430/919, 920, 923, 281, 430/915; 252/426; 204/159.23, 159.18

[56] References Cited

U.S. PATENT DOCUMENTS

| | | | |
|---|---|---|---|
| 3,488,269 | 1/1970 | Allen et al. | 204/159.23 |
| 3,573,922 | 4/1971 | Rusi | 204/159.24 |
| 3,650,917 | 3/1972 | Livinos | 204/159.24 |
| 3,682,641 | 8/1972 | Casler | 96/35.1 |
| 3,729,404 | 4/1973 | Morgan | 204/159.15 |
| 3,933,682 | 1/1976 | Bean | 204/159.23 |

OTHER PUBLICATIONS

Ledwith, J. Oil Co. Chem. Assoc., vol. 59, pp. 157–165 (1976).
J. of Amer. Chem. Soc., vol. 97, pp. 4139–4141, Jul. 1975, Libman.
Hackh's Chemical Dictionary 25 and 192, 1969.
Murov, handbook of Photochemistry pp. 203–206, 1973.

*Primary Examiner*—Jack P. Brammer
*Attorney, Agent, or Firm*—Dana M. Schmidt

[57] ABSTRACT

A co-initiator for use in an improved photopolymerization composition, element and method is disclosed. The photopolymerizaton composition comprises an addition-polymerizable compound containing ethylenic unsaturation and the co-initiator which includes a photopolymerization activator and an amine-substituted ketocoumarin sensitizer having an absorption maximum between about 350 and about 550 nm; said activator having the structure

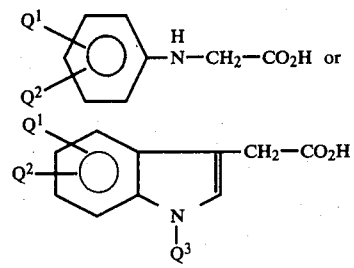

wherein $Q^1$ and $Q^2$ are each independently hydrogen; alkyl, thioalkyl or alkoxy containing from 1 to about 5 carbon atoms; aryl or aryloxy or benzoyloxy containing from about 6 to 10 carbon atoms; hydroxy; or halogen; or together $Q^1$ or $Q^2$ are the necessary atoms to complete a fused heterocyclic or aromatic ring containing from about 4 to 6 ring atoms; and $Q^3$ is hydrogen or alkyl containing from 1 to about 5 carbon atoms.

9 Claims, No Drawings

PHOTOPOLYMERIZATION CO-INITIATOR COMPOSITIONS COMPRISING AMINE-SUBSTITUTED KETOCOUMARINS AND CERTAIN ACETIC ACID DERIVATIVE ACTIVATORS

INTRODUCTION

1. Field of the Invention

This invention relates to co-initiators used to photoinitiate the polymerization of addition polymerizable compounds containing ethylenic unsaturation.

2. Background of the Invention

Mixed photoinitiators, sometimes known as co-initiators, have been disclosed for use with addition polymerizable monomers. Co-initiators usually comprise two compounds, a light-sensitive compound sometimes identified as a sensitizer, and an activator compound. The activator is substantially insensitive to activating radiation for the co-initiator coposition; but, in the presence of the photoexcited sensitizer, the activator is believed to contribute to the formation of a free-radical. The known classes of such activators include amines, sulfinic acid and sulfinic acid esters, sulfones, $\alpha$- and $\beta$-dicarbonyls such as bornanedione and acetylacetone, phosphines, phosphites, stannates, and hexaarylbiimidazoles.

An early example of an effective co-initiator composition has been Michler's ketone as the sensitizer, admixed with benzophenone as the activator, e.g., as described in U.S. Pat. No. 3,682,641. This composition has long been considered an industry standard. More recently, a number of aromatic carbonyl compounds have been disclosed as useful sensitizers with amine activators to form co-initiators of many kinds. Such compositions are described in Ledwith, *J. Oil Col. Chem. Assoc.*, 59, p. 157 and especially p. 162-164 (1976). The carbonyls specifically identified are phenones, including cyclic ketones, such as benzophenone, fluorenones, anthraquinones and anthrones.

Although such co-initiators have been highly effective, most of them are not responsive to visible light, thus requiring UV radiation. Some co-initiators have been found to have a spectral response in the visible wave-lengths, but their speed has been so much less than the speed of industry standards such as Michler's ketone and benzophenone that they have not been acceptable.

Thus there has been a long-existing need prior to this invention for the development of a co-initiator composition that not only is responsive to visible light radiation, but also has a speed comparable to or better than the speed of conventional UV-responsive co-initiators.

3. Related Applications

Commonly owned U.S. Application Ser. No. 049,661 filed on June 18, 1979 by Specht et al, entitled "Photopolymerizable Compositions Featuring Novel Co-Initiators" discloses and claims 3-ketocoumarins in combination with activators, such as amines, in general.

SUMMARY OF THE INVENTION

This invention features a visible light-responsive co-initiator composition for an improved photopolymerization composition, elements, and methods. The featured co-initiator compositions contain an amine-substituted ketocoumarin sensitizer responsive to visible light and a specific amine activator, as described hereinafter, effective to provide increased photopolymerization light sensitivity (i.e., speed), compared to other known amine activators. With this speed improvement, the present invention provides an effective co-initiator responding to radiation of wavelengths between about 350 and about 550 nm.

More specifically, there is provided a co-initiator composition comprising a coumarin sensitizer having an absorptive maximum between about 350 and 550 nm, a

substituent in the 3-position wherein $R^1$ is alkyl or alkenyl having 1 to 12 carbon atoms, or a carbocyclic or heterocyclic group having 5 to 20 carbon and hetero ring atoms, and an amine substituent in the 5, 6, 7, or 8 position; and an activator having a structure

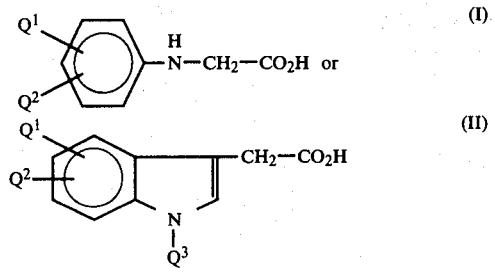

wherein $Q^1$ and $Q^2$ are each independently hydrogen, alkyl, alkoxy or thioalkyl containing from 1 to about 5 carbon atoms, for example, methyl, ethyl, propyl, thiomethyl, thiopropyl, methoxy, ethoxy, isopropoxy, and the like; aryl or aryloxy containing from about 6 to 10 carbon atoms; such as phenyl, naphthyl, phenoxy, and the like; benzoyloxy hydroxy; or halogen such as chloride, bromide and the like; or together $Q^1$ and $Q^2$ are the necessary atoms to complete a fused heteroyclic or aromatic ring containing from about 4 to 6 ring atoms, for example, benzene, thiophene, furane, pyran, pyridine, and the like; and $Q^3$ is hydrogen or alkyl containing from 1 to about 5 carbon atoms, for example, methyl, ethyl, propyl, and the like.

Such co-initiator composition, when added to an addition polymerizable compound, provides an improved photopolymerizable composition.

Other features of the invention will become apparent upon reference to the following "Description of the Preferred Embodiments".

DESCRIPTION OF THE PREFERRED EMBODIMENTS

The term "addition-polymerizable" or "addition polymerization" refers to the chain reaction that occurs wherein a single photon causes the addition of more than one recurring unit to a growing polymer, in contrast with single-event crosslinking wherein a single photon creates generally only one crosslink event. Without being limited to specific mechanisms, addition polymerization achievable with this invention preferably involves the production of free radicals. The term "photosensitizer" broadly includes both materials which sensitize single-event crosslinking of photopolymers as well as those, such as are included in the present, "co-initiator compositions," which sensitize only addition polymerization of simple compounds or polymers.

As used herein, "carbocyclic", "aryl", "aromatic" "heterocyclic", "alkyl", and "alkoxy" include substituted as well as unsubstituted carbocyclic, aryl, aromatic, heterocyclic, alkyl and alkoxy, respectively, unless otherwise specified. Suitable substituents include alkoxy containing from 1 to about 5 carbon atoms, such as methoxy, ethoxy, propoxy, butoxy, and the like; sulfonates, such as fluorosulfonate and the like; cyano; dialkylamino such as dimethylamino, diethylamino and the like; halo such as chloro, bromo and the like; nitro; hydroxy; and alkyl of from 1 to about 5 carbon atoms, such as methyl, ethyl, propyl and the like. Also, alkenyl includes aryl- or alkyl-substituted alkenyl, for example, styryl, cinnamylidenemethyl, 2-(2-thienyl)vinyl and the like.

As used herein, amine substituents in the ketocoumarins include heterocyclic, non-aromatic N-containing groups, fused or unfused.

The photopolymerizable composition of the invention comprises an addition-polymerizable compound containing ethylenic unsaturation, and a co-initiator composition comprising an admixture of a 3-substituted ketocoumarin bearing an amine substituent in the 5, 6, 7, or 8 position, and a photopolymerization activator as defined in formulas (I) and (II) in the Summary.

Any compound containing ethylenic unsaturation which is addition polymerizable can be used in the invention. Preferred are simple compounds, or monomers as they are sometimes called, containing ethylenic unsaturation, as well as polymers containing end groups or pendent groups terminating with ethylenic unsaturation. For example, the phrase "addition-polymerizable compounds" includes polymers having recurring units with the structure

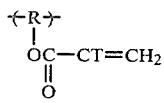

wherein R is any polymer backbone-forming group and T is hydrogen or methyl.

Other examples of useful addition-polymerizable compounds containing ethylenic, unsaturation include monomeric acrylates, acrylamides, methacrylates, methacrylamides, allyl compounds, vinyl ethers, vinyl esters, N-vinyl compounds, styrenes and crotonates. Many examples of each of these classes are well known, e.g., as listed in British Patent Specification No. 1,534,137, published Nov. 29, 1978, the details of which are expressly incorporated herein by reference. Acrylonitrile is also useful.

Highly preferred as addition-polymerizable compounds are the acrylate compounds as a class. Acrylates for years have been used in photopolymerization and a wide variety have been identified in the literature. Particularly useful examples include alkyl acrylates containing from 1 to about 10 and most preferably 1 to about 5 carbon atoms in the alkyl portion, such as methyl acrylate, ethyl methacrylate and the like; pentaerythritol tri- and tetraacrylates and methacrylates; esters of polyols including glycol diacrylates and dimethacrylates, such as tripropylene glycol diacrylates, tetraethylene glycol diacrylate, triethylene glycol dimethacrylate, and the like; alkanediol diacrylates such as hexanediol diacrylates and the like; polyether diacrylates such as that obtainable from UCB, a division of Cimique Chausse de Charleroi, Brussels, Belgium under the trade name "Ebecryl 210;" and mixtures of the above. Particularly preferred are diacrylates and mixtures of tetraacrylates and tetramethacrylates.

Of the two components of the co-initiator composition, the one which preferably predominates as the light-absorbing component is the coumarin. That is, preferably greater than about 50% of the activating radiation, and in some cases, all of that radiation, is absorbed by the coumarin. In accordance with one aspect of the invention, the coumarin is a 3-ketocoumarin bearing a wide variety of substituents appended to the carbonyl group. A preferred group of such coumarins as those having the formula

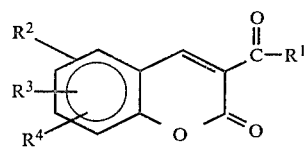

wherein $R^1$ is as defined above, and $R^2$, $R^3$ and $R^4$ are the same or different and are each hydrogen; dialkylamino containing from 1 to about 5 carbon atoms in the alkyl portion, such as dimethylamino, diethylamino, and the like; N-pyrrolidinyl; piperidinyl; and morpholino; or $R^2$–$R^4$, when taken together, comprise the nonmetallic atoms that form, as a fused substituent on the coumarin ring, the rings

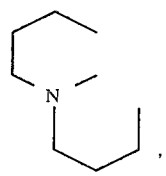

povided that at least one of $R^2$, $R^3$, and $R^4$ is other than hydrogen. Examples of heterocyclic groups for $R^1$ include benzofuryl, thienyl, furyl, pyridyl and the like. 3-Coumarinyl groups are additional preferred examples of such heterocyclic groups.

The 3-ketocoumarins of this invention are particularly useful with broad spectral light sources such as xenon and halogen lamps, or with limited wavelength sources such as mercury lamps having emission spectra at 366, 405, 436 and 547 nm, or lasers emitting at 488 nm or 515 nm.

The following is a listing of coumarins highly useful as one of the components of the co-initiator composition of the invention:

3-(2-benzofuroyl)-7-diethylaminocoumarin;
3-(2-benzofuroyl)-7-(1-pyrrolidinyl)coumarin;
7-dimethylamino-3-thenoylcoumarin;
3-(o-methoxybenzoyl)-7-diethylaminocoumarin;
3-(p-dimethylaminobenzoyl)-7-diethylaminocoumarin;
3,3'-carbonylbis(7-diethylaminocoumarin);
7-diethylamino-3-[3-(2-thienyl)acryloyl]coumarin;
3-(2-furoyl)-7-diethylaminocoumarin;
3-(p-diethylaminocinnamoyl)-7-diethylaminocoumarin;
3-(4-morpholinocinnamoyl)-7-diethylaminocoumarin;

9-(7-diethylamino-3-coumarinoyl)-1,2,4,5-tetrahydro-3H,6H,10H[1]benzopyrano[9,9a,1-gh]quinolazine-10-one; which has the structure:

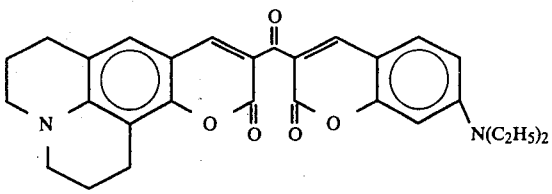

9-(7-di-n-propylamino-3-coumarinoyl)-1,2,4,5-tetrahydro-3H,6H,10H[1]benzopyrano[9,9a,1-gh]quinolazine-10-one;
9-(4-diethylaminocinnamoyl)-1,2,4,5-tetrahydro-3H,6H,10H[1]benzopyrano[9,9a,1-gh]quinolazine-10-one;
7-dimethylamino-3-[3-(2-thienyl)acryloyl]coumarin;
9-[3-(2-thienyl)acryloyl]-1,2,4,5-tetrahydro-3H,6H,10H[1]-benzopyrano[9,9a,1-gh]quinolazine-10-one;
7-diethylamino-3-(4-dimethylaminocinnamylideneacetyl)-coumarin;
9-[3-(9-julolidyl)acryloyl]-1,2,4,5-tetrahydro-3H,6H,10H[1]-benzopyrano[9,9a,1-gh]quinolazine-10-one;
3-cinnamoyl-7-diethylaminocoumarin;
7-diethylamino-3-(4-morpholinocinnamoyl)coumarin;
7-diethylamino-3-(4-ethoxycinnamoyl)coumarin;
3-(4-bromocinnamoyl)-7-diethylaminocoumarin;
7-diethylamino-3-[3-(4-methoxy-1-naphthyl)acryloyl]-coumarin;
7-diethylamino-3-cinnamylideneacetylcoumarin;
9-[3-(2-thienyl)acryloyl]-1,2,4,5-tetrahydro-3H,6H,10H-[1]benzopyrano[9,9a,1-gh]quinolazine-10-one;
7-diethylamino-3-(3-fluorosulfonylbenzoyl)coumarin;
3-(4-cyanobenzoyl)-7-diethylaminocoumarin;
3-benzoyl-7-dimethylaminocoumarin;
3-benzoyl-7-diethylaminocoumarin;
3-benzoyl-7-pyrrolidinylcoumarin;
3-(4-iodobenzoyl)-7-dimethylaminocoumarin;
3-(4-iodobenzoyl)-7-diethylaminocoumarin;
7-dimethylamino-3-(4-dimethylaminobenzoyl)-coumarin;
7-diethylamino-3-(4-nitrobenzoyl)coumarin;
7-diethylamino-3-(2-thenoyl)coumarin;
7-pyrrolidinyl-3-(2-thenoyl)coumarin;
7-diethylamino-3-(2-furoyl)coumarin; and
7-diethylamino-3-(2-methoxybenzoyl)coumarin.

A mixture of two or more of any of the above coumarins can also be used.

Conventional methods can be used to prepare these coumarins. For example, preparations are disclosed in the aforesaid U.S. Pat. No. 4,147,552.

The free-radical photopolymerization activator used in the composition of this invention has the structure set forth in the Summary. Among those compounds having such structure, N-phenylglycine and N-methylindoleacetic acid are preferred. The selected activators of this invention have been found to produce, with coumarins of the type noted above, a photopolymerization speed that is unexpectedly improved. In contrast, these selected activators give speeds that are at best only comparable to, and often less than, the speed provided by many other amine activators, if the ketocoumarin is free of amine substituents in the 5, 6, 7, or 8 positions.

The amount of coumarin sensitizer used does not appear to be critical. The coumarin is typically present in the range of about 0.0002 to about 0.2 mmole per gram of dry solids content. Actual preferred examples tested were in the range of from about 0.005 to about 0.015 mmole per gram.

Of course, sufficient activator needs to be present to allow interaction between the excited coumarin and the activator. The activator is typically present in amounts between about 0.005 and about 2.0 mmole per gram of dry solids, and preferably between about 0.05 to about 0.2.

In certain applications, a binder can be optionally added to the composition. The polymerizable compound is generally present from about 5 to about 100 weight percent of the mixture of that compound and the binder.

The dry thickness of the composition can vary widely. When applied to a support, the dry thickness is typically between about 1 micron and about 1 mm, and is preferably between about 20 and about 120 microns. The composition of the invention can be applied to a support by a wide variety of techniques such as spray-coating, whirler-coating, curtain-coating, roll-coating, and the like, all of which are conventional.

Typically, coating is carried out by selecting any suitable solvent for preparing a dope of the composition to be coated on a support. Typical examples include dichloromethane, acetone, benzene, alcohols, ethers, toluene, and the like. The choice will depend, of course, upon the polymerizable compound and the activator selected as well as upon other components that might be included, e.g., polymeric binders.

The support for the composition, if necessary or desired, includes a variety of known supports, including photographic supports. Typical useful supports include polymeric film, wood fiber—e.g., paper, metallic sheet and foil, glass and ceramic supporting elements. Such supports are often provided with one or more subbing layers to enhance the adhesive, antistatic, dimensional, abrasive, hardness, frictional, and/or other properties of the support surface as desired.

Typical of useful polymeric film supports are films of cellulose nitrate and cellulose esters such as cellulose triacetate and diacetate, polystyrene, polyamides, homo and copolymers of vinyl chloride, poly(vinyl acetal), polycarbonate, homo and copolymers of olefins, such as polyethylene and polypropylene, and polyesters of dibasic aromatic carboxylic acids with divalent alcohols, such as poly(ethylene terephthalate).

Typical of useful paper supports are those which are partially acetylated or coated with baryta and/or a polyolefin, particularly a polymer of an α-olefin containing 2 to 10 carbon atoms, such as polyethylene, polypropylene, copolymers of ethylene and propylene and the like.

Further details of useful supports will be found in Research Disclosure, Vol. 176, Publication No. 17643, Para. XVII (Dec. 1978), published by Industrial Opportunities Ltd., Homewell, Havant, Hampshire, P09 1EF, United Kingdom, the content of which is expressly incorporated herein by reference.

The compositions of the invention have utility in a wide variety of applications. For example, one embodiment of the invention is an element comprising a metallic support bearing the photopolymerizable composition of the invention, preferably along with a polymeric binder. Particularly preferred metallic supports are copper foil. Such an element is useful in microelectronics and photofabrication, wherein the foil is etched into desired configurations. In such a use, the photopolymerizable composition of the invention, together with a compatible binder, acts as a negative resist in that is exposed and developed to form, for example, annular-shaped spacers for beam leads that are etched out of the metal foil using a positive-working resist for the beam lead portions of the metal. Certain examples of such a use are described in U.S. Pat. No. 3,795,043, issued on Mar. 5, 1974. As used herein, a binder is "compatible" if it forms with the co-initiator composition a single phase coating, when dried, and does not interfere with the photoaddition polymerization capability of the composition.

When binders are desired as an additional component, they can be selected from addition polymers, e.g., homopolymers, copolymers and terpolymers of vinyl, especially acrylic monomers; and condensation polymers, e.g., polyesters, polyamides and polysulfonamides, mixtures of the above, and the like. Such binders are not needed, however, even in resist applications, when the polymerizable compound and co-initiator composition are film-forming in and of themselves, e.g., when the polymerizable compound is of a relatively high molecular weight such as an oligomer or a polymer. Plasticizers can be included in the photopolymerizable compositions of the invention for specific purposes or applications. However, in some cases better speeds are obtained by omitting them.

Additionally, the photopolymerizable compositions of the invention can be used to manufacture polymeric coatings and other articles of manufacture that are uniformly, rather than imagewise, exposed to activating radiation.

EXAMPLES

The following examples further illustrate the nature of the invention.

EXAMPLES 1–18

To demonstrate the unexpected speed results noted above for the co-initiator composition of the present invention containing amine-substituted ketocoumarins and N-phenylglycine (NPG), compared to the relative performance of NPG when used with ketocoumarins lacking an amine substituent on the coumarin ring, dopes were prepared using the following composition:

| | |
|---|---|
| ketocoumarin of Table I | 0.08 millimole |
| amine activator of Table I (in 2 ml ethanol or dichloromethane, for NPG or DMAB, respectively) | 0.80 millimole |
| 13 ml of: | |
| Pentaerythritol tetraacrylate | 45.0 g |
| Pentaerythritol tetramethacrylate | 60.0 g |
| t-Butyl 4-hydroxy-5-methylphenyl sulfide (stabilizer) | 1.05 g |
| Poly(methyl methacrylate-co-butyl methacrylate-co-acrylic acid) (34:63:3) available from Rohm & Haas under the trademark "Acryloid B48N" | 120 g |
| Poly(methyl methacrylate) available from Rohm & Haas under the trademark "Acryloid A-11" | 120 g |
| Dibutyl phthalate (plasticizer) | 50.4 g |
| Dichloromethane solvent | 535.2 g |

In the examples using NPG, the NPG was purified prior to making the composition by recrystallizating it from toluene.

Each dope solution was placed in an ultrasonic bath as an aid to attaining complete solution. The solution was coated at a wet thickness of 300 microns on a copper support on a coating block maintained at 18° C. After 5 minutes, the temperature of the block was raised to 66° C. for 10 minutes. The coating was then placed in an oven at 90° C. for 10 minutes.

Test strips were exposed for 180 seconds through a Kodak T-14 step tablet and a polypropylene cover sheet using a Colight Xposer I device, which uses a 400W medium-pressure mercury lamp. The exposed test strips were developed for 55 seconds in a processing tank containing 1,1,1-trichloroethane, rinsed for 5 seconds with fresh 1,1,1-trichloroethane, rinsed with water, and dried.

All speeds were determined by examining the last solid step produced after development, compared to such a step produced by a control formulation. The control initially was the preceding formulation, except using 0.09 mmole Michler's ketone and 0.8 mmole of benzophenone as the coinitiator. This control in turn was verified by comparing a large number of replicates of the control against Comparative Example F to determine that the relative speed of Comparative Example F to Michler's ketone-benzophenone is 3.5. Thereafter, all tests were made by comparing the developed results against the speed of Comparative Example F, rather than that of Michler's ketone-benzophenone, for the reason that comparisons become difficult when the relative speed is much faster than that of the control. The final speed results are stated as they would be compared to Michler's ketone-benzophenone as the co-initiator because the latter composition is usually regarded as the conventional industry standard.

TABLE I

| | | Relative Speeds[2] | | |
|---|---|---|---|---|
| Example | Ketocoumarin | When Using DMAB as a Comparative Activator[1] | When Using N-phenyl glycine(NPG) | NPG Speed ÷ DMAB Speed |

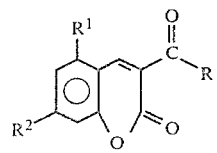

Comp.   $R^1$ = H, $R^2$ = methoxy

TABLE I-continued

| Example | Ketocoumarin | | When Using DMAB as a Comparative Activator | When Using NPG | NPG Speed ÷ DMAB Speed |
|---|---|---|---|---|---|
| Ex. A | R = phenyl | | 2.6 | 2.3 | 0.9 |
| Comp. Ex. B | $R^1$ = H, $R^2$ = methoxy; R = -C$_6$H$_4$-SO$_2$F | | 3.2 | 2.5 | 0.8 |
| Comp. Ex. C | $R^1$ & $R^2$ = ethoxy; R = thienyl | | 2.1 | 1.9 | 0.9 |

[1]DMAB = ethyl p-dimethylaminobenzoate and is not an activator of the invention.
[2]Compared to a speed of 1 for Michler's ketone-benzophenone as explained above. Accuracy of all speeds noted herein is about ± 20%.

| Example | Ketocoumarin | | Relative Speeds When Using DMAB as a Comparative Activator | When Using NPG | NPG Speed ÷ DMAB Speed |
|---|---|---|---|---|---|
| Comp. Ex. D | $R^1$ & $R^2$ = n-propoxy; R = phenyl | | 3.1 | 3.0 | 0.97 |
| Comp. Ex. E | $R^1$ & $R^2$ = n-propoxy; R = -C$_6$H$_4$-CN | | 5.7 | 6.1 | 1.07 |
| Comp. Ex. F | $R^1$ & $R^2$ = n-propoxy; R = coumarinyl | | 3.5 | 5 ± 0.5 | 1.3–1.6 |

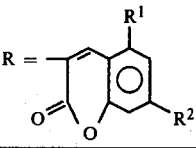

| Example | $R^3$ | $R^4$ | $R^5$ | R | When Using DMAB as a Comparative Activator | When Using NPG | NPG Speed ÷ DMAB Speed |
|---|---|---|---|---|---|---|---|
| Ex. 1 | H | diethylamino | H | phenyl | 0.4 | 2.8 | 7.0 |
| 2 | H | diethylamino | H | o-methoxyphenyl | 0.48 | 4.7 | 9.8 |
| 3 | H | diethylamino | H | m-fluorosulfonylphenyl | 0.35 | 2.0 | 5.7 |
| 4 | H | diethylamino | H | p-iodophenyl | 0.3 | 2.2 | 7.3 |
| 5 | H | diethylamino | H | p-dimethylaminophenyl | 0.08 | 2.1 | 26.3 |
| 6 | H | diethylamino | H | furyl | 1.2 | 4 | 3.3 |
| 7 | H | diethylamino | H | benzofuryl | 3.5 | 4.9 | 1.4 |
| 8 | H | pyrrolidinyl | H | benzofuryl | 3.5 | 7.0 | 2.0 |
| 9 | H | diethylamino | H | 7-diethylamino-4-methylcoumarinyl | 0.5 | 5.9 | 11.8 |

TABLE I-continued

| # | R³, R⁴, R⁵ | | | Substituent | col1 | col2 | col3 |
|---|---|---|---|---|---|---|---|
| 10 | Together R³, R⁴, & R⁵ are the atoms which form the rings | | | (methyl-coumarin with N—(C₃H₇)₂) | 0.12 | 3.2 | 26.7 |
| 11 | H | diethyl amino | H | styryl | 0.28 | 1.1 | 3.9 |
| 12 | H | diethyl amino | H | —CH=CH—C₆H₄—N(CH₂CH₃)₂ | 0.2 | 4.4 | 22 |
| 13 | H | diethyl amino | H | —CH=CH—N(morpholino) | 0.34 | 3.1 | 9.1 |
| 14 | H | diethyl amino | H | —CH=CH—(benzofuryl) | 0.43 | 3.6 | 8.4 |
| 15 | Together R³, R⁴ & R⁵ are the atoms which form the rings | | | —CH=CH—(thienyl) | 0.21 | 1.4 | 6.7 |
| 16 | Together R³, R⁴ & R⁵ are the atoms which form the rings | | | —CH=CH—C₆H₄—N(CH₂CH₃)₂ | 0.3 | 3.5 | 11.7 |
| 17 | Together R³, R⁴ & R⁵ are the atoms which form the rings | | | —CH=CH—(julolidyl) | 0.25 | 1.4 | 5.6 |
| 18 | H | diethyl amino | H | —CH=CH / CH=CH—C₆H₄—N(CH₃)₂ | 0.08 | 1.6 | 20 |

The first part of Table I indicates that, for the 6 "Comparative Examples" using ketocoumarins lacking the amine substituents, the best speed that NPG could produce was 1.6 that of the other amine co-initiators. In most instances it is less than that produced by the others. Examples 1–18 on the other hand demonstrate a surprising result: NPG, when used with amine-substituted ketocoumarins, as defined herein, gave speeds that were generally higher, and usually far superior, to the speeds obtained using other amines, as indicated by the ratio of "NPG speed" to "DMAB speed" being in each instance for Examples 1–18, greater than 1.0. (This relationship remains true even if slightly higher NPG speeds are obtained in the comparative examples by omitting the dibutyl phthalate). For example, the ratio in Examples 2, 5, 9, 10 and 12 was 9.8, 26.3, 11.8, 26.7, and 22, respectively. For these, a very fast speed was obtained even compared to the industry favorite Michler's ketone-benzophenone, e.g., a speed that was 4.7 times as fast for Example 2, 5.9 times as fast for Example 9, and 4.4 times as fast for Example 12.

EXAMPLES 19–22

These examples demonstrate the unexpected speed results noted above for the co-initiator composition of the present invention containing amine-substituted ketocoumarins and 3-indoleacetic acid (IAA), compared to the relative performance of IAA when used with a ketocoumarin lacking an amine substituent on the nucleus. The dopes of Example 1 were repeated, except 0.8 millimole of either 3-indoleacetic acid or DMAB (as a comparative activator) were used with 0.08 mmole of the ketocoumarins of Table II. As in the case of Examples 1–18, Comparative Examples G and H were prepared using the non-amine substituted ketocoumarins to demonstrate that IAA is a relatively poor activator in such a control co-initiator system, compared to other amine activators such as DMAB.

TABLE II

| Example | Ketocoumarin | Relative Speeds When Using DMAB as a Comparative Activator | When Using IAA | IAA speed ÷ DMAB Speed |
| --- | --- | --- | --- | --- |
| Comp. Ex. G | 3-benzoyl-7-methoxycoumarin | 3.0 | 0.68 | 0.23 |
| H | 3,3'-carbonylbis-(5,7-di-n-propoxy coumarin) | 3.5 | 1.18 | 0.34 |
| 19 | 3-(2-benzofuroyl)-7-diethylaminocoumarin | 3.5 | 2.6 | 0.74 |
| 20 | 3,3'-carbonylbis(7-diethylaminocoumarin) | 0.5 | 0.6 | 1.2 |
| 21 | 3-(p-diethylaminostyryl)-carbonyl)-7-diethylamino coumarin | 0.2 | 0.6 | 3.0 |
| 22 | 9-(p-diethylaminostyryl-carbonyl)-1,2,4,5-tetra-hydro-3H,6H,10H[1]benzo-pyrano[9,9a,1-gh]quinolazine-10-one | 0.3 | 0.6 | 2.0 |

Thus, IAA also demonstrates as a class an unexpectedly good speed compared to the speed of amines such as DMAB, when used with an amine-substituted ketocoumarin.

EXAMPLE 23

To demonstrate that NPG is superior in its performance as compared to amines other than DMAB, Example 5 was repeated except that N-methyl-N-phenyl-N-benzylamine was the comparative activator used. The speed for this amine, relative to Michler's ketone-benzophenone, was 0.2, giving a "NPG speed" to "other amine speed" ratio of 10.5.

EXAMPLES 24–27

To demonstrate the unexpected speed that results when N-methylindoleacetic acid (MeIAA) is used, the procedure of Example 1 was repeated except that dibutyl phthalate was omitted, the activator was N-methylindoleacetic acid, and 4-t-butylpyrocatechol was used in place of t-butyl 4-hydroxy-5-methylphenyl sulfide. Exposure and speeds were made and determined as described for Example 1. The results, set forth in Table III, indicate a marked speed increase (a ratio of speeds much greater than 1.0) when MeIAA was used as the activator together with amine-substituted 3-ketocoumarin sensitizers, compared to what would be predicted from the speed achieved when using DMAB as the activator. The controls, on the other hand, indicate that improved speeds for MeIAA would not be expected, compared to the speeds for DMAB, based upon the results obtained using non-amine-substituted ketocoumarins.

TABLE III

| | | Relative Speeds[1] | | |
| --- | --- | --- | --- | --- |
| Example | Ketocoumarin | When Using DMAB as a Comparative Activator[2] | When Using MeIAA | MeIAA Speed ÷ DMAB Speed |
| Comp. Ex. I | 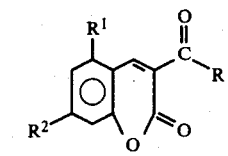 $R^1$ = H, $R^2$ = methoxy R = phenyl | 2.8 | 1.65 | 0.59 |
| Comp. Ex. J | $R^1$ = $R^2$ = n-propoxy | 3.5 | 3.3 | 0.94 |
| Ex. 24 | 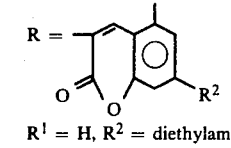 $R^1$ = H, $R^2$ = diethylamino | 4.3 | 10.6 | 2.47 |
| Ex. 25 | 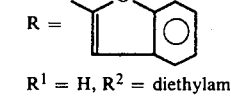 $R^1$ = H, $R^2$ = diethylamino | 0.5 | 3.5 | 7.0 |

TABLE III-continued

| | | Relative Speeds[1] | | |
|---|---|---|---|---|
| Example | Ketocoumarin | When Using DMAB as a Comparative Activator[2] | When Using MeIAA | MeIAA Speed ÷ DMAB Speed |
| Ex. 26 | R = 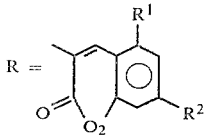 $R^1$ = H, $R^2$ = diethylamino | 0.2 | 4.3 | 21.5 |
| Ex. 27 | R = 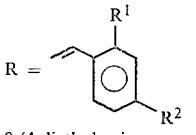 9-(4-diethylamino-cinnamoyl)-1,2,4,5-tetrahydro-3H,6H,10H[1]benzopyrano[9,9a,1-gh]quinolazine-10-one | 0.4 | 5.1 | 12.8 |

[1]Compared to a speed of 1.0 for Michler's ketone plus benzophenone.
[2]DMAB is as defined for Table I.

EXAMPLES 28a & b, and 29a & b

Examples 25 and 26 were repeated, respectively, except that the indoleacetic acid activator was as follows:

| Example | Ketocoumarin | Activator |
|---|---|---|
| 28a | That of Ex. 25 | 5-methoxy-indole-acetic acid |
| 28b | That of Ex. 25 | 5-benzoyloxy-indole-acetic acid |
| 29a | That of Ex. 26 | 5-methoxy-indole-acetic acid |
| 29b | That of Ex. 26 | 5-benzoyloxy-indole-acetic acid |

The speed results were, calculated as before:

| Example | Speeds |
|---|---|
| 28a | 1.4 |
| 28b | 1.2 |
| 29a | 1.5 |
| 29b | 1.4 |

The invention has been described in detail with particular reference to certain preferred embodiments thereof, but it will be understood that variations and modifications can be effected within the spirit and scope of the invention.

What is claimed is:

1. In a photopolymerizable composition comprising an addition-polymerizable compound and a co-initiator composition comprising a carbonyl sensitizer and a photopolymerization activator;

the improvement wherein said sensitizer is an amine-substituted ketocoumarin having an adsorption maximum between about 350 and 550 nm and a

substituent in the 3-position wherein $R^1$ is alkyl or alkenyl having 1 to 12 carbon atoms, or a carbocy-clic or heterocyclic group having 5 to 20 carbon and hetero ring atoms; and wherein said activator has the structure

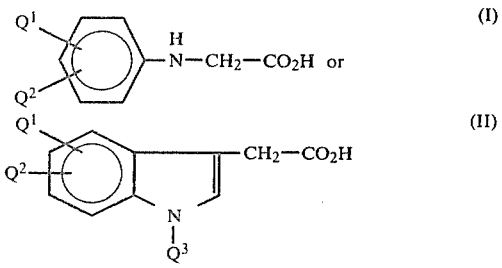

wherein $Q^1$ and $Q^2$ are each independently hydrogen; alkyl, alkoxy, or thioalkyl containing from 1 to 5 carbon atoms; aryl, aryloxy, or benzoyloxy containing from 6 to 10 carbon atoms; hydroxy; or halogen; or together $Q^1$ and $Q^2$ are the necessary atoms to complete a fused heterocyclic or aromatic ring containing from 4 to 6 ring atoms; and $Q^3$ is hydrogen or alkyl containing from 1 to 5 carbon atoms.

2. A composition as defined in claim 1, wherein said addition-polymerizable compound is an acrylate.

3. In a photopolymerizable composition comprising an addition-polymerizable compound and a co-initiator composition comprising a carbonyl sensitizer and a photopolymerization activator;

the improvement wherein said sensitizer is an amine-substituted coumarin having an adsorption maximum between about 350 and 550 nm and the structure

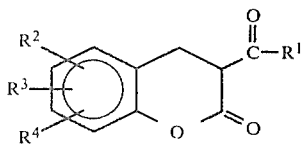

wherein $R^1$ is selected from the group consisting of alkyl or alkenyl having 1 to 12 carbon atoms, or a carbocyclic or heterocyclic group having 5 to 20 carbon and hetero ring atoms; and, $R^2$, $R^3$, and $R^4$ are the same or different and are each hydrogen, dialkylamino containing from 1 to 5 carbon atoms in the alkyl portion, N-pyrrolidinyl, piperdinyl, morpholino, or when taken together $R^2$–$R^4$ comprise the nonmetallic atoms that form, as a fused substituent on the coumarin ring, the ring

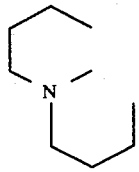

provided that at least one of $R^2$, $R^3$, and $R^4$ is other than hydrogen; and, wherein said activator has the structure

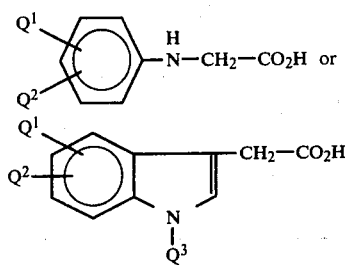

wherein $Q^1$ and $Q^2$ are each independently hydrogen; alkyl, alkoxy or thioalkyl containing from 1 to about 5 carbon atoms; aryl, aryloxy, or benzoyloxy containing from about 6 to 10 carbon atoms; hydroxy; or halogen; or together $Q^1$ and $Q^2$ are the necesary atoms to complete a fused heterocyclic or aromatic ring containing from about 4 to 6 ring atoms; and $Q^3$ is hydrogen or alkyl containing from 1 to about 5 carbon atoms.

4. In a photopolymerizable composition comprising an addition-polymerizable compound and a co-initiator composition comprising a carbonyl sensitizer and a photopolymerization activator;

the improvement wherein said sensitizer is a coumarin selected from the group consisting of
3-(2-benzofuroyl)-7-diethylaminocoumarin;
3-(2-benzofuroyl)-7-(1-pyrrolidinyl)coumarin;
7-dimethylamino-3-thenoylcoumarin;
3-benzoyl-7-diethylaminocoumarin;
3-(o-methoxybenzoyl)-7-diethylaminocoumarin;
3-(p-dimethylaminobenzoyl)-7-diethylaminocoumarin;
3,3'-carbonylbis(7-diethylaminocoumarin);
7-diethylamino-3-[3-(2-thienyl)acryloyl]coumarin;
3-(2-furoyl)-7-diethylaminocoumarin;
3-(p-diethylaminocinnamoyl)-7-diethylaminocoumarin;
3-(4-morpholinocinnamoyl)-7-diethylaminocoumarin;
9-(7-diethylamino-3-coumarinoyl)-1,2,4,5-tetrahydro-3H,6H,10H[1]benzopyrano[9,9a,1-gh]quinolazine-10-one;
9-(7-di-n-propylamino-3-coumarinoyl)-1,2,4,5-tetrahydro-3H,6H,10H[1]benzopyrano[9,9a,1-gh]quinolazine-10-one;
9-(4-diethylaminocinnamoyl)-1,2,4,5-tetrahydro-3H,6H,10H[1]benzopyrano[9,9a,1-gh]quinolazine-10-one;
7-dimethylamino-3-[3-(2-thienyl)acryloyl]coumarin;
9-[3-(2-thienyl)acryloyl]-1,2,4,5-tetrahydro-3H,6H,10H[1]-benzopyrano[9,9a,1-gh]quinolazine-10-one;
7-diethylamino-3-(4-dimethylaminocinnamylideneacetyl)coumarin;
9-[3-(9-julolidyl)acryloyl]-1,2,4,5-tetrahydro-3H,6H,10H[1]-benzopyrano[9,9a,1-gh]quinolazine-10-one;
3-cinnamoyl-7-diethylaminocoumarin;
7-diethylamino-3-(4-morpholinocinnamoyl)coumarin;
7-diethylamino-3-(4-ethoxycinnamoyl)coumarin;
3-(4-bromocinnamoyl)-7-diethylaminocoumarin;
7-diethylamino-3-[3-(4-methoxy-1-naphthyl)acryloyl]coumarin;
7-diethylamino-3-cinnamylideneacetylcoumarin;
9-[3-(2-thienyl)acryloyl]-1,2,4,5-tetrahydro-3H,6H,10H-[1]benzopyrano[9,9a,1-gh]quinolazine-10-one;
7-diethylamino-3-(3-fluorosulfonylbenzoyl)coumarin;
3-(4-cyanobenzoyl)-7-diethylaminocoumarin;
3-benzoyl-7-dimethylaminocoumarin;
3-benzoyl-7-diethylaminocoumarin;
3-benzoyl-7-pyrrolidinylcoumarin;
3-(4-iodobenzoyl)-7-dimethylaminocoumarin;
3-(4-iodobenzoyl)-7-diethylaminocoumarin;
7-dimethylamino-3-(4-dimethylaminobenzoyl)-coumarin;
7-diethylamino-3-(4-nitrobenzoyl)coumarin;
7-diethylamino-3-(2-thenoyl)coumarin;
7-pyrrolidinyl-3-(2-thenoyl)coumarin;
7-diethylamino-3-(2-furoyl)coumarin; and
7-diethylamino-3-(2-methoxybenzoyl)coumarin; and wherein said activator is selected from the group consisting of N-phenylglycine, indole-3-ylacetic acid, and N-methylindole-3-ylacetic acid.

5. In a radiation-responsive element including a support bearing a photopolymerizable layer comprising an addition-polymerizable compound and a co-initiator composition comprising a carbonyl sensitizer and a photopolymerization activator;

the improvement wherein said sensitizer is an amine-substituted ketocoumarin having an adsorption maximum between about 350 and 550 nm and a

substituent in the 3-position wherein $R^1$ is alkyl or alkenyl having 1 to about 12 carbon atoms, or a carbocyclic or heterocyclic group having about 5 to about 20 carbon and hetero ring atoms; and, wherein said activator has the structure

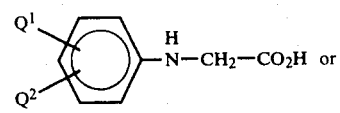

-continued

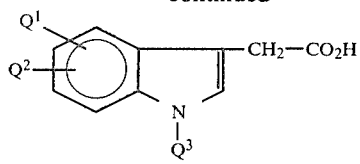
(II)

wherein $Q^1$ and $Q^2$ are each independently hydrogen; alkyl, alkoxy or thioalkyl containing from 1 to about 5 carbon atoms; aryl, aryloxy, or benzoyloxy containing from about 6 to 10 carbon atoms; hydroxy; or halogen; or together $Q^1$ and $Q^2$ are the necessary atoms to complete a fused heterocyclic or aromatic ring containing from about 4 to 6 ring atoms; and $Q^3$ is hydrogen or alkyl containing from 1 to about 5 carbon atoms.

6. An element as defined in claim 5, wherein said polymerizable compound is an acrylate.

7. A method of addition-photopolymerization comprising exposing to activating radiation a composition comprising a addition-polymerizable compound containing ethylenic unsaturation of a co-initiaton composition comprising
(a) an amine-substituted ketocoumarin sensitizer having an absorption maximum between about 350 and about 550 nm and a

substituent in the 3-position wherein $R^1$ is alkyl or alkenyl having 1 to 12 carbon atoms, or a carbocyclic or heterocyclic group having about 5 to 20 carbon and hetero ring atoms; and
(b) an activator having the structure

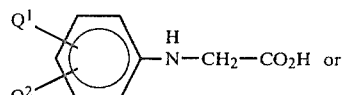
(I)

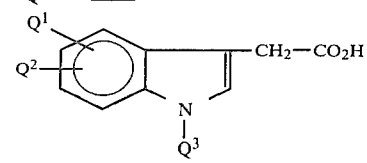
(II)

wherein $Q^1$ and $Q^2$ are each independently hydrogen; alkyl, alkoxy or thioalkyl containing from 1 to about 5 carbon atoms, aryl, aryloxy, or benzoyloxy containing from about 6 to 10 carbon atoms; hydroxy; or halogen; or together $Q^1$ and $Q^2$ are the necessary atoms to complete a fused heterocyclic or aromatic ring containing from about 4 to 6 ring atoms; and $Q^3$ is hydrogen or alkyl containing from 1 to about 5 carbon atoms.

8. A co-initiator composition for photo-initiating addition polymerization, said composition comprising
(a) an amine-substituted ketocoumarin sensitizer having an adsorption maximum between about 350 and 550 nm, and a

substituent in the 3-position wherein $R^1$ is alkyl or alkenyl having 1 to 12 carbon atoms, or a carbocyclic or heterocyclic group having 5 to 20 carbon and hetero ring atoms; and
(b) an activator having the structure

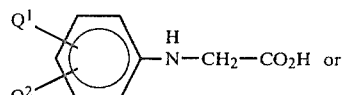
(I)

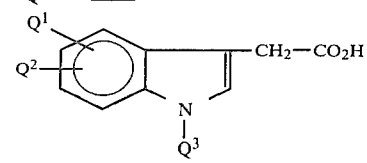
(II)

wherein $Q^1$ and $Q^2$ are each independently hydrogen; alkyl, alkoxy or thioalkyl containing from 1 to about 5 carbon atoms; aryl, aryloxy, or benzoyloxy containing from about 6 to 10 carbon atoms; hydroxy; or halogen; or together $Q^1$ and $Q^2$ are the necessary atoms to complete a fused heterocyclic or aromatic ring containing from about 5 to 6 ring atoms; and $Q^3$ is hydrogen or alkyl containing from 1 to about 5 carbon atoms.

9. A co-initiator composition for photoinitiating addition polymerization, said composition comprising an amine-substituted coumarin sensitizer having an adsorption maximum between about 350 l and 550 nm, and the structure

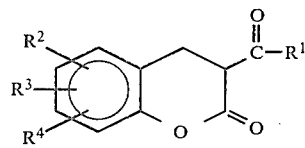

wherein
$R^1$ is selected from the group consisting of alkyl or alkenyl having 1 to 12 carbon atoms, or a carbocyclic or heterocyclic group having 5 to 20 carbon and hetero ring atoms; and
$R^2$, $R^3$, and $R^4$ are the same or different and are each hydrogen, dialkylamino containing from 1 to 5 carbon atoms in the alkyl portion, N-pyrrolidinyl, piperidinyl, morpholino, or when taken together $R^2$-$R^4$ comprise the non-metallic atoms that form, as a fused substituent on the coumarin ring, the ring

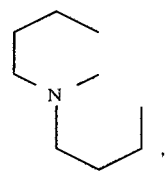

provided that at least one of $R^2$, $R^3$, and $R^4$ is other than hydrogen; and
an activator having the structure

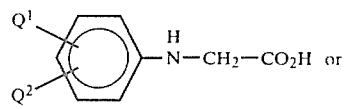
(I)

-continued

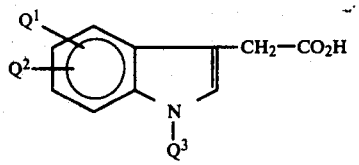
(II)

wherein $Q^1$ and $Q^2$ are each independently hydrogen; alkyl, alkoxy or thioalkyl containing from 1 to about 5 carbon atoms; aryl, aryloxy, or benzoyloxy containing from about 6 to 10 carbon atoms; hydroxy; or halogen; or together $Q^1$ and $Q^2$ are the necessary atoms to complete a fused heterocyclic or atomatic ring containing from about 4 to 6 ring atoms; and $Q^3$ is hydrogen or alkyl containing from 1 to about 5 carbon atoms.

* * * * *

UNITED STATES PATENT AND TRADEMARK OFFICE
CERTIFICATE OF CORRECTION

PATENT NO. : 4,278,751

DATED : July 14, 1981

INVENTOR(S) : Donald P. Specht, Kenneth L. Payne and Samir Y. Farid

It is certified that error appears in the above-identified patent and that said Letters Patent are hereby corrected as shown below:

Col. 16, line 61, the formula should read as follows:

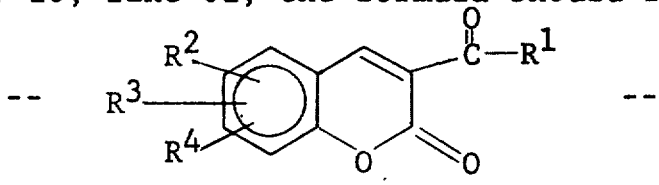

Col. 19, line 22 reading " co-initiaton " should read -- co-initiator --.

Col. 19, line 62 reading " 550 nm, " should read -- 550 nm --.

Col. 20, line 29, reading " 350 1 and " should read -- 350 and --.

UNITED STATES PATENT AND TRADEMARK OFFICE

CERTIFICATE OF CORRECTION

PATENT NO. : 4,278,751
DATED : July 14, 1981
INVENTOR(S) : Donald P. Specht, Kenneth L. Payne and Samir Y. Farid It is certified that error appears in the above-identified patent and that said Letters Patent are hereby corrected as shown below.

Col. 20, line 34, the formula should read as follows:

-- 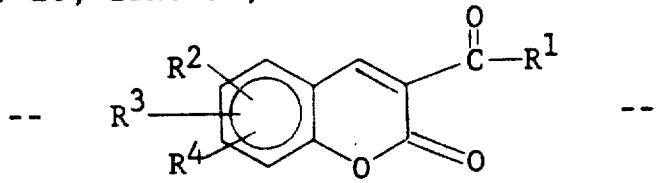 --

Signed and Sealed this

Eighth Day of June 1982

[SEAL]

Attest:

GERALD J. MOSSINGHOFF

Attesting Officer

Commissioner of Patents and Trademarks